(12) United States Patent
Koutny, Jr. et al.

(10) Patent No.: US 6,171,180 B1
(45) Date of Patent: Jan. 9, 2001

(54) PLANARIZING A TRENCH DIELECTRIC HAVING AN UPPER SURFACE WITHIN A TRENCH SPACED BELOW AN ADJACENT POLISH STOP SURFACE

(75) Inventors: William W. C. Koutny, Jr., Santa Clara; Chidambaram G. Kallingal, Sunnyvale; Krishnaswamy Ramkumar, San Jose, all of CA (US)

(73) Assignee: Cypress Semiconductor Corporation, San Jose, CA (US)

( * ) Notice: Under 35 U.S.C. 154(b), the term of this patent shall be extended for 0 days.

(21) Appl. No.: 09/052,219

(22) Filed: Mar. 31, 1998

(51) Int. Cl.[7] .................................... B24B 29/00

(52) U.S. Cl. ..................... 451/287; 451/41; 451/288
(58) Field of Search .................. 451/41, 58, 288, 451/287

(56) References Cited

U.S. PATENT DOCUMENTS

| 3,629,023 | 12/1971 | Strehlow | 156/345 |
| 3,979,239 | 9/1976 | Walsh | 156/4 |

(List continued on next page.)

FOREIGN PATENT DOCUMENTS 0 303 061    2/1989  (EP) .

OTHER PUBLICATIONS

Ali et al., "Chemical–Mechanical Polishing of Interlayer Dielectric: A Review," *Solid State Technology*, Oct. 1994, pp. 63–68.

Sivaram et al., "Developments in Consumables Used in the Chemical Mechanical Polishing of Dielectrics," *International Conference on Solid State Devices & Materials*, Aug. 1995, p. 166.

Wolf, *Silicon Processing for VLSI Era vol. 2: Process Integration*, Lattice Press 1990, pp. 189–191.

Singer, "CMP Developers Take Aim at STI Applications" and "Slurry–Free CMP Reduces Dishing, Speeds Process," *Semiconductor International*, Feb. 1998, vol. 21, No. 2, p. 40.

Singer, "CMP Developers Take Aim at STI Applications" *Semiconductor International*, vol. 21, No. 2, p. 40.

Singer, "Slurry–Free CMP Reduces Dishing, Speeds Process" *Semiconductor International*, vol. 21, No. 2, p. 40.

\* cited by examiner

*Primary Examiner*—Joseph J. Hail, III
*Assistant Examiner*—William Hong
(74) *Attorney, Agent, or Firm*—Kevin L. Daffer; Conley, Rose & Tayon

(57) ABSTRACT

The present invention advantageously provides a method for using an abrasive surface and a particle-free liquid to polish a dielectric, wherein the dielectric is deposited within an isolation trench and across a polish stop surface such that a recess region of the dielectric is spaced below the polish stop surface. In an embodiment, the dielectric is an isolation oxide, and the polish stop surface belongs to an upper surface of a nitride layer formed above a silicon-based substrate. The surface of the dielectric is positioned laterally adjacent the abrasive polishing surface such that the particle-free liquid is positioned at the interface between the dielectric and the polishing surface. The particle-free liquid is preferably deionized water, and the abrasive polishing surface is preferably a polymeric matrix entrained with particles composed of, e.g., ceria. A force configured perpendicular to the backside of the substrate is applied to the polishing surface to force the dielectric surface against the polishing surface while the polishing surface is being rotated relative to the dielectric. As a result, elevationally raised regions of the dielectric are polished to the recessed region of the dielectric, planarizing the dielectric surface. The polish rate of the dielectric is substantially greater than that of the polish stop surface, and thus the polishing stop layer remains intact above the substrate. The polish rate of the elevationally raised regions of the dielectric is also greater than that of the recess region of the dielectric.

31 Claims, 5 Drawing Sheets

U.S. PATENT DOCUMENTS

| | | | |
|---|---|---|---|
| 4,256,535 | 3/1981 | Banks | 156/645 |
| 4,261,791 | 4/1981 | Shwartzman | 156/628 |
| 4,373,991 | 2/1983 | Banks | 156/645 |
| 4,505,720 | 3/1985 | Gabor et al. | 51/295 |
| 4,600,469 | 7/1986 | Fusco et al. | 156/636 |
| 4,677,043 | 6/1987 | Cordes, III et al. | 430/22 |
| 4,768,883 | 9/1988 | Waldo et al. | 356/399 |
| 4,778,532 | 10/1988 | McConnell et al. | 134/10 |
| 4,789,648 | 12/1988 | Chow et al. | 437/225 |
| 4,879,258 | 11/1989 | Fisher | 437/225 |
| 4,933,715 | 6/1990 | Yamada et al. | 355/53 |
| 4,944,836 * | 7/1990 | Beyer et al. | 156/645 |
| 4,954,141 | 9/1990 | Takiyama et al. | 51/296 |
| 4,962,423 | 10/1990 | Yamada et al. | 358/101 |
| 4,968,381 | 11/1990 | Prigge et al. | 156/636 |
| 4,986,878 | 1/1991 | Malazgirt et al. | 156/643 |
| 5,032,203 | 7/1991 | Doy et al. | 156/345 |
| 5,057,462 | 10/1991 | Eisenberg et al. | 437/229 |
| 5,064,683 * | 11/1991 | Poon et al. | 427/39 |
| 5,084,419 | 1/1992 | Sakao | 437/228 |
| 5,209,816 | 5/1993 | Yu et al. | 156/636 |
| 5,273,558 | 12/1993 | Nelson et al. | 51/298 |
| 5,288,333 | 2/1994 | Tanaka et al. | 134/31 |
| 5,320,706 | 6/1994 | Blackwell | 156/636 |
| 5,320,978 | 6/1994 | Hsu | 437/192 |
| 5,340,370 | 8/1994 | Cadien et al. | 51/308 |
| 5,346,584 | 9/1994 | Nasr et al. | 156/636 |
| 5,362,668 | 11/1994 | Tasaka | 437/67 |
| 5,362,669 | 11/1994 | Boyd et al. | 437/67 |
| 5,363,550 * | 11/1994 | Aitken et al. | 29/828 |
| 5,376,482 | 12/1994 | Hwang et al. | 430/5 |
| 5,389,194 | 2/1995 | Rostoker et al. | 156/636 |
| 5,389,579 | 2/1995 | Wells | 437/225 |
| 5,392,361 | 2/1995 | Imaizumi et al. | 382/8 |
| 5,395,801 | 3/1995 | Doan et al. | 437/225 |
| 5,401,691 | 3/1995 | Caldwell | 437/228 |
| 5,406,111 * | 4/1995 | Sun | 257/497 |
| 5,435,772 | 7/1995 | Yu | 451/63 |
| 5,436,488 | 7/1995 | Poon et al. | 257/397 |
| 5,441,094 | 8/1995 | Pasch | 156/636.1 |
| 5,459,096 | 10/1995 | Venkatesan et al. | 437/67 |
| 5,468,983 | 11/1995 | Hirase et al. | 257/344 |
| 5,486,265 | 1/1996 | Salugsugan | 156/636.1 |
| 5,492,858 | 2/1996 | Bose et al. | 437/67 |
| 5,494,857 | 2/1996 | Cooperman et al. | 437/228 |
| 5,503,962 | 4/1996 | Caldwell | 430/317 |
| 5,525,840 | 6/1996 | Tominaga | 257/797 |
| 5,531,861 * | 7/1996 | Yu et al. | 156/636.1 |
| 5,541,427 | 7/1996 | Chappell et al. | 257/306 |
| 5,551,986 | 9/1996 | Jain | 134/6 |
| 5,573,633 | 11/1996 | Gambino et al. | 156/636.1 |
| 5,578,523 | 11/1996 | Fiordalice et al. | 437/190 |
| 5,591,239 | 1/1997 | Larson et al. | 51/294 |
| 5,595,937 | 1/1997 | Mikagi | 437/192 |
| 5,607,345 | 3/1997 | Barry et al. | 451/539 |
| 5,616,513 | 4/1997 | Shepard | 438/402 |
| 5,629,242 | 5/1997 | Nagashima et al. | 438/692 |
| 5,643,406 | 7/1997 | Shimomura et al. | 156/636.1 |
| 5,643,823 | 7/1997 | Ho et al. | 437/67 |
| 5,643,836 | 7/1997 | Meister et al. | 437/228 |
| 5,652,176 | 7/1997 | Maniar et al. | 437/67 |
| 5,656,097 | 8/1997 | Olesen et al. | 134/1 |
| 5,664,990 | 9/1997 | Adams et al. | 451/60 |
| 5,665,202 | 9/1997 | Subramanian et al. | 438/692 |
| 5,666,985 | 9/1997 | Smith, Jr. et al. | 134/142 |
| 5,702,977 * | 12/1997 | Jang et al. | 437/67 |
| 5,728,308 | 3/1998 | Muroyama | 216/88 |
| 5,776,808 * | 7/1998 | Muller et al. | 438/243 |
| 5,837,612 * | 11/1998 | Ajuria et al. | 438/697 |
| 5,906,532 | 5/1999 | Nakajima et al. | 451/41 |
| 5,919,082 * | 7/1999 | Walker et al. | 451/41 |
| 5,952,687 * | 9/1999 | Kawakubo et al. | 257/296 |

PLANARIZING A TRENCH DIELECTRIC HAVING AN UPPER SURFACE WITHIN A TRENCH SPACED BELOW AN ADJACENT POLISH STOP SURFACE

BACKGROUND OF THE INVENTION

1. Field of the Invention

This invention relates to integrated circuit manufacturing and, more particularly, to using an abrasive surface and a particle-free liquid to polish a dielectric, wherein the dielectric is deposited within an isolation trench and across a polish stop surface such that a recess region of the dielectric is spaced below the polish stop surface.

2. Description of the Related Art

Fabrication of a multi-level integrated circuit involves numerous processing steps. Numerous active devices are first placed within and upon a single semiconductor substrate. Those devices built into the substrate are separated or "isolated" from each other by dielectric structures. Select devices are interconnected by conductors which extend over an interlevel dielectric that isolates those devices. Contact areas are placed through the interlevel dielectric to electrically link the interconnect routing to select devices. Alternating levels of interlevel dielectric and interconnect may be placed across the semiconductor topography. Isolation of the multiple interconnect levels and of the active devices from each other is necessary to provide for the fabrication of a reliable integrated circuit.

Unfortunately, unwanted surface irregularities (i.e., elevational disparities) occur across the topological surface of an integrated circuit during the formation of each level of the circuit. For example, an isolation dielectric formed on a topography of an integrated circuit may contain elevationally raised and recess regions. In particular, the upper surface of a trench isolation structure formed within, e.g., a silicon-based substrate, may contain elevational disparities which contribute to the non-uniformity of the isolation structure depth and/or thickness. Relatively shallow trench isolation structures are typically formed within the semiconductor substrate to isolate impurity regions of active devices placed in the substrate. If left unattended, elevational disparities in each level of an integrated circuit can lead to various problems. For example, when an interconnect is placed across a dielectric having elevationally raised and recessed regions, step coverage problems may arise. Step coverage is defined as a measure of how well a film conforms over an underlying step and is expressed by the ratio of the minimum thickness of a film as it crosses a step to the nominal thickness of the film on horizontal regions. Furthermore, correctly patterning layers upon a topological surface containing fluctuations in elevation using optical lithography may be difficult. Lithography involves using an optical system to expose certain areas of a photosensitive material (i.e., photoresist) to radiation. The depth-of-focus of the optical system may vary depending on whether the photoresist resides in an elevational "hill" or "valley" area, causing images projected onto the photoresist to be skewed in lateral dimension.

The concept of utilizing chemical and mechanical abrasion to planarize or remove the surface irregularities of a topological surface is well known in industry as chemical-mechanical polishing ("CMP"). As shown in FIG. 1, a typical CMP process involves placing a semiconductor wafer 12 face-down on a polishing pad 14 which is fixedly attached to a rotatable table or platen 16. Elevationally extending features of semiconductor wafer 12 are positioned such that they contact the slurry attributed to the CMP process. A popular polishing pad medium comprises polyurethane or polyurethane-impregnated polyester felts. During the CMP process, polishing pad 14 and semiconductor wafer 12 may be rotated while a carrier 10 holding wafer 12 applies a downward force F upon polishing pad 14. An abrasive, fluid-based chemical, often referred to as a "slurry", is deposited from a conduit 18 positioned above pad 14 upon the surface of polishing pad 14. The slurry becomes positioned in the space between pad 14 and the surface of wafer 12. The slurry initiates the polishing process by chemically reacting with the surface material being polished. The rotational movement of polishing pad 14 relative to wafer 12 causes abrasive particles entrained within the slurry to physically strip the reacted surface material from wafer 12. The abrasive slurry particles are typically composed of silica, alumina, or ceria.

Delivery of the slurry must be carefully monitored to ensure that the slurry does not unduly accumulate in select regions of the topography. If too much slurry accumulates in a relatively small area, that area may scratch the underlying surface or, in the extreme, polish at an unacceptably high polish rate. A post-CMP cleaning step is required to remove residual slurry particles from the surface of the polished topography. Without adequately removing the slurry, abrasive slurry particles will remain on the semiconductor topography and contaminate that surface. Considering the minute dimensions of integrated circuit topological features, even the tiniest of defect in the semiconductor topography can render the ensuing integrated circuit inoperable. Unfortunately, the removal of such slurry particles may be time consuming and costly. Further, some types of cleaning procedures can be detrimental to the semiconductor topography. The slurry waste must also be disposed of and subjected to waste treatment after planarization is complete because of the toxic nature of some of the effluent components. The disposal and waste treatment of the slurry effluent significantly increases the cost of manufacturing the integrated circuit.

FIGS. 2–5 illustrate the formation of a trench isolation structure within a semiconductor substrate, according to a conventional technique. As shown in FIG. 2, a semiconductor substrate 20 comprising, e.g., lightly doped single crystalline silicon is provided. A silicon nitride ("nitride") layer 24 is arranged across the upper surface of substrate 20. A "pad" oxide layer 22 may be interposed between substrate 20 and nitride layer 24 to reduce inherent stresses between nitride and silicon. As shown, portions of nitride layer 24 and substrate 20 are etched away to define a trench 26 within substrate 20. Turning to FIG. 3, fill oxide 28 (i.e., silicon dioxide) is then deposited into trench 26 to a level spaced above the upper surface of nitride layer 24 using chemical-vapor deposition ("CVD"). Prior to depositing fill oxide 28, a thermally grown oxide liner may be formed at the periphery of trench 26 while nitride layer 24 protects the upper surface of silicon-based substrate 20 from being oxidized. The resulting upper surface of fill oxide 28 includes a recess region 30 elevationally raised above the trench area. A CMP step is then performed to planarize the surface of the semiconductor topography. The thickness, $t_1$, of the fill oxide 28 above nitride layer 24 must be sufficiently large e.g., 6,000 Å, to ensure that recess region 30 does not extend below the uppermost surface of substrate 20. Otherwise, portions of substrate 20 would have to be removed to achieve complete planarization of fill oxide 28, causing contamination of the substrate "active areas" beneath nitride layer 24. Moreover, ensuing impurity regions implanted into the active areas would not receive an optimal dosage and/or implant profile. In the extreme, implant regions might extend below the base of fill oxide 28, undesirably permitting current leakage between isolated active areas. Unfortunately, forming a relatively thick fill oxide 28 above nitride layer 24 means that the time period required for the deposition of fill oxide 28 can be rather lengthy. As such, preventing recess region 30 from extending below the uppermost surface of substrate 20 may be achieved at the expense of a loss in the throughput and an increase in the costs of an integrated circuit manufacturer.

FIG. 4 illustrates the formation of a trench isolation structure 32 comprising fill oxide 28 formed exclusively between ensuing active areas of substrate 20. Trench isolation structure 32 is formed by subjecting the semiconductor topography depicted in FIG. 3 to the CMP process. The topological surface is polished to a level spaced below the original upper surface of nitride layer 24 to ensure that fill oxide 28 no longer resides above nitride layer 24. During the CMP process, the slurry, being a relatively viscous fluid, will flow to the elevationally recessed region 30 of fill oxide 28. The slurry thusly placed may react with the surface material primarily at elevationally recessed region 30, releasing the surface material from its union with the bulk of fill oxide 28. Further, the polishing pad, being somewhat conformal to the topological surface, may deform above recess region 30 by "bowing" in an arcuate pattern in response to a force being applied thereto. Accordingly, the polishing pad may physically strip the reacted surface material from recess region 30 of fill oxide 28. Thus, although the removal rate of elevationally raised regions is greater than that of elevationally recessed region 30, a significant amount of the elevationally recessed region 30 may still be removed. Consequently, a "dishing" effect commonly associated with the CMP process may be observed. That is, the upper surface 34 of trench isolation structure 32 may curve below the polished upper surface of nitride layer 42, as shown. The dishing effect may be so severe that the upper surface of trench isolation structure 32 extends below the uppermost surface of substrate 20. Therefore, the conventional CMP process does not necessarily lead to complete planarization of a topological surface, particularly one that is formed above a large-area trench. Of greater disadvantage is the possibility that CMP exposes the substrate active area corners near the isolation structures.

Subsequent to the CMP process, nitride layer 24 and pad oxide layer 22 may be removed from substrate 20 using a selective etch technique, as depicted in FIG. 5. Since surface 34 of trench isolation structure 32 is recessed below the uppermost surface of substrate 20, only a relatively thin layer of oxide remains laterally adjacent corner areas 36 of substrate 20. In the extreme, no oxide may cover corner areas 36. Thus, ensuing impurity regions formed within substrate 20 may extend above surface 34. The exposed corner areas 36 of those impurity regions might suffer unreasonably low breakdown voltages. Conductive contacts formed upon the impurity regions might be mis-aligned such that the contacts are arranged laterally adjacent corner areas 36. Moreover, a local interconnect which extends a relatively short distance across the semiconductor topography may be placed laterally adjacent those corner areas 36. In either case, current may inadvertently flow between impurity regions which are supposed to be separated by trench isolation structure 32. Increasing the initial thickness of nitride layer 24 might inhibit the subsequent exposure of corner areas 36 of substrate 20. The tensile and compressive stresses between an enlarged nitride layer 24 and silicon-based substrate 20 could become so large that warping of the semiconductor topography might result. Increasing the initial thickness of pad oxide 22 is not a viable option either. This might lead to unwanted oxidation of substrate 20. The non-planarity of surface 34 of trench isolation structure 32 also results in poor step coverage of a material, e.g., an interlevel dielectric, deposited across the isolation structure. In addition to the CMP dishing effect, non-uniform etching of substrate 20 during trench formation and non-uniform deposition of the fill oxide may also contribute to the elevational fluctuations in surface 34.

It would therefore be desirable to develop a process for polishing a semiconductor topography which selectively removes raised areas faster than recessed areas of the same material, or one material in lieu of another material. As such, it is necessary to prevent the CMP polishing fluid from reacting with the elevationally recessed regions of the semiconductor topography. Further, using a substantially rigid polishing pad that does not significantly deform when subjected to pressure would inhibit the removal of the elevationally recessed regions. The desired planarization process could be applied to planarization of a dielectric in a trench isolation process. A trench isolation structure could thus be formed which includes a planar upper surface raised above an adjacent substrate surface. Therefore, exposing corner areas of impurity regions subsequently formed within the substrate would not be a concern. Further, good step coverage of a material deposited across the planar surface of the trench isolation structure could be achieved. In the instance that a trench isolation structure is to be formed, the thickness of the fill dielectric above the nitride layer must be reduced to increase the throughput and reduce the costs of integrated circuit fabrication. It would also be beneficial to devise a polish process that does not require the costly removal and treatment of slurry waste. Further, a CMP and/or polish process is needed in which there is less risk of the semiconductor topography being damaged or contaminated by abrasive slurry particles during and/or following CMP.

SUMMARY OF THE INVENTION

The problems outlined above are in large part solved by the planarization technique hereof for polishing a dielectric formed within a trench and across a polish stop layer adjacent the trench. A liquid which is substantially free of particulate matter is placed between the dielectric and an abrasive polishing surface entrained with particles. The abrasive surface is moved relative to the semiconductor topography so as to polish the dielectric. The polish stop layer is composed of a material which does not undergo significant polishing by the process hereof, and thus withstands removal as the dielectric is being polished. The abrasive polishing surface belongs to a polishing pad which is substantially resistant to deformation even when placed across an elevationally recessed region of relatively large lateral dimension (e.g., over 200 microns lateral dimension). Therefore, the pad is non-conformal to the underlying surface and thus does not come in contact with elevationally recessed regions of the dielectric.

It is believed that the particles dispersed throughout the abrasive surface in combination with the polishing liquid interact chemically and physically with those regions of the dielectric placed in contact with the particles. However, the liquid alone is believed to have little effect on the dielectric and thus does not remove recessed areas of the dielectric which the abrasive surface does not contact. As such, elevationally raised regions of the dielectric are removed at a substantially faster rate than elevationally recessed regions, permitting planarization of the dielectric surface without the occurrence of the dishing effect. Advantageously, the planar dielectric surface may afford good step coverage of a material subsequently formed across the surface. Absent the use of a slurry, no slurry waste stream is generated during the planarization process. Accordingly, the cost and loss of time incurred to dispose of a slurry effluent is no longer a concern. Further, since the liquid applied to the polishing surface is void of particulate matter, it is less probable that abrasive particles will remain upon the semiconductor topography to damage or contaminate the surface of the semiconductor topography.

Absent the dishing effect, the thickness of the dielectric initially deposited into the trench and across the polish stop layer may be reduced since recessed region surfaces no longer need to be formed a spaced distance above the polish stop surface to ensure that the dielectric surface is not polished below the substrate surface. Therefore, the time period required for the deposition of the dielectric may be decreased, affording an increase in the throughput and a decrease in the costs of manufacturing an integrated circuit. The benefit of decreasing deposition time and amount can equally apply to the polish stop layer as well. It therefore follows that the silicon nitride, for example, can be deposited to a thinner dimension than conventional silicon nitride polish stop layers. The removal rate of the elevationally raised regions of the dielectric is greater than that of the topological surface after planarization has been achieved. Therefore, it is desirable to deposit the dielectric such that a recessed region in the upper surface of the dielectric above the trench is spaced below the polish stop surface (i.e., the upper surface of the polish stop layer) and above the uppermost substrate surface. This configuration of the recessed region ensures that the dielectric is completely removed from the polish stop surface before the planarization process slows down. Further, the planarized surface of the trench isolation structure employing the dielectric is maintained above the uppermost substrate surface. As such, the corner regions of the substrate adjacent the trench boundary remain covered by the trench dielectric. The planarization process hereof therefore alleviates concerns that those corner regions might become exposed and permit deleteriously low breakdown voltages of and current leakage between impurity regions subsequently formed within the substrate.

The polishing technique hereof is particularly applicable to forming a trench isolation structure comprising oxide. According to an embodiment, a nitride layer is deposited across a pad oxide arranged upon a semiconductor substrate. The nitride layer serves as a polish stop layer during the planarization process. Portions of the nitride layer and the pad oxide are etched to the substrate surface, and then a trench is etched in the substrate. A fill oxide is CVD deposited into the trench and across the nitride layer such that a recess region formed in the fill oxide is spaced below the upper surface of the nitride layer. The topological surface of the fill oxide is then polished. The polishing process involves directing deionized water onto an abrasive polishing surface comprising a polymer-based matrix entrained with particles which are composed of a material selected from the group consisting of cerium oxide, cerium dioxide, aluminum oxide, silicon dioxide, titanium oxide, chromium oxide, and zirconium oxide. Liquids other than deionized water may also be used as the polishing fluid, however, it is preferable to use a fluid having a near-neutral pH value. A more acidic or basic liquid might undesirably increase the removal rate of the nitride layer. The pH chosen is one suitable for the polished surface and the abrasive polishing pad. The polishing fluid is purposefully absent slurry material, such as sodium and/or heavy metals, which could deleteriously harm the electrical performance of the circuit area proximate the surface being polished. It is noted that the slurry absent from the present fluid could, of course, have other damaging components which could actively or passively contaminate the surface being polished.

The semiconductor topography is positioned face-downward upon the abrasive surface such that the deionized water is interposed at the abrasive surface/fill oxide interface. Polishing begins when the semiconductor topography is pressed against the abrasive surface and the topography and the abrasive surface are moved relative to each other. A polishing pad which supports the abrasive surface is substantially rigid and does not significantly deform about the length of the pad when undergoing normal pressure even when placed over a relatively large trench area.

At first, the elevationally raised regions of the fill oxide are polished to the underlying surface of the nitride layer. As the polishing process is continued, the nitride layer does not undergo significant polishing. Also, the raised regions of the fill oxide are removed at a faster rate than the recessed region of the fill oxide. Eventually, the raised regions of the fill oxide become flush with the recessed region of the fill oxide. At this point, the polishing rate slows down significantly. In this manner, the upper surface of the resulting trench isolation structure within the trench is substantially planarized. The polishing process exhibits a relatively high selectivity for raised regions (i.e., steps) as compared to a planar topological surface. Moreover, the polishing process exhibits a high selectivity for raised oxide regions relative to nitride regions. Overall polish selectivity can be thought of as a combination of oxide-to-nitride selectively and the selectivity of raised regions to planar regions. In the former instance, selectivity may be approximately 4:1. However, selectivity as to geographical or topological removal rates as in the latter instance can be approximately 20:1. Therefore, the overall selectivity to oxide removal in raised regions relative to nitride removal in planar regions can be thought of as a product of the 4:1 and 20:1 ratios, or 80:1.

In contrast to a conventional CMP process, the uniformity of the trench isolation structure (i.e., the elevational uniformity of the upper surface and the depth uniformity) are no longer dependent upon the polishing process hereof. That is, the polishing process does not contribute to the non-uniformities in the trench isolation structure. The uniformity of the fill oxide CVD deposited across the topography and the uniformity of the trench etch step are the main factors that affect the uniformity of the trench isolation structure. The reduction in the thickness of the fill oxide deposited into the trench and across the nitride affords decreased elevational disparities in the upper surface of the fill oxide. Therefore, the process hereof provides for the formation of a trench isolation structure having higher uniformities in elevation and depth.

BRIEF DESCRIPTION OF THE DRAWINGS

Other objects and advantages of the invention will become apparent upon reading the following detailed description upon reference to the accompanying drawings in which.

Figure 1:
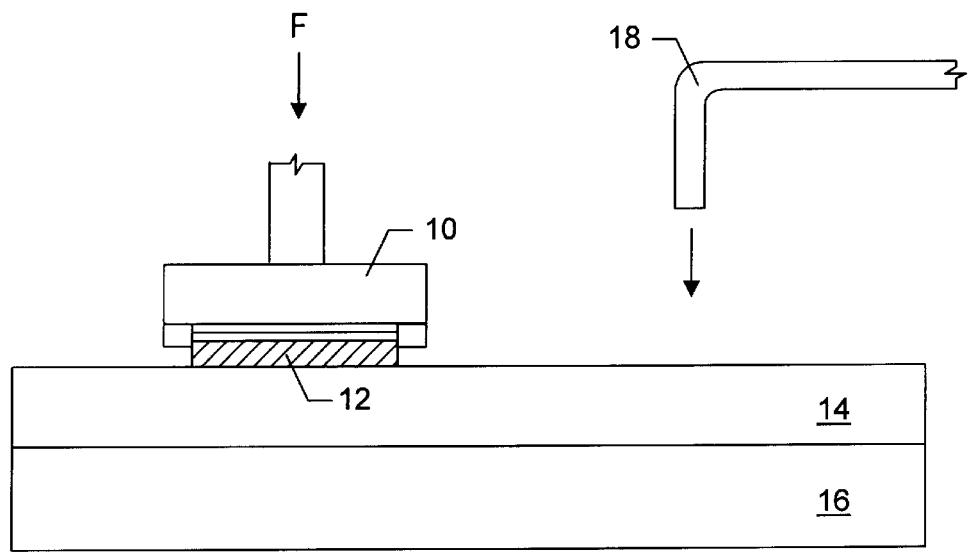
FIG. 1 is a side plan view of an apparatus that may be used to chemical-mechanical polish a semiconductor topography.
Figure 2:
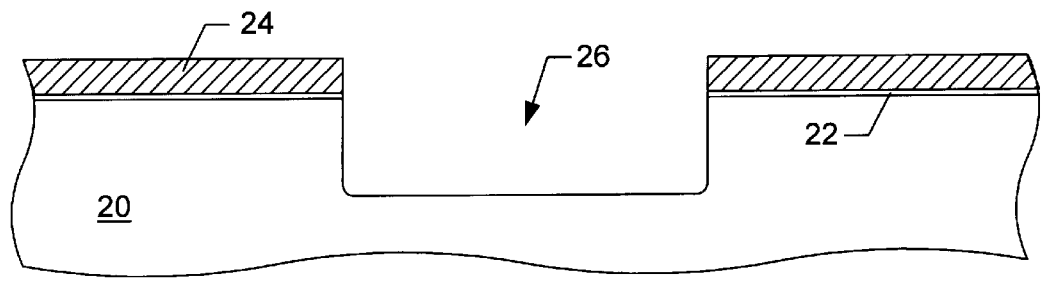
FIG. 2 is a partial cross-sectional view of a semiconductor topography, wherein a trench is formed within a semiconductor substrate upon which a nitride layer is arranged.
Figure 3:
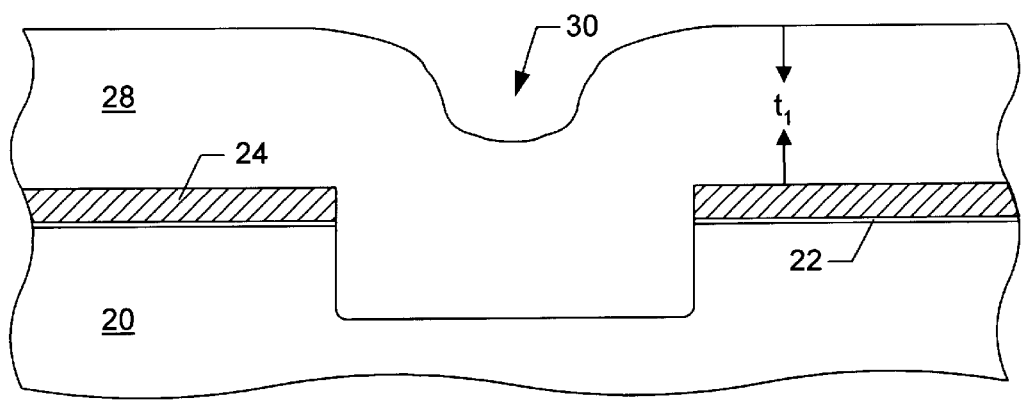
FIG. 3 is a partial cross-sectional view of the semiconductor topography, wherein a fill oxide is deposited into the trench to a level spaced above the nitride layer such that a recess is formed within the upper surface of the fill oxide, subsequent to the step in FIG. 2.
Figure 4:
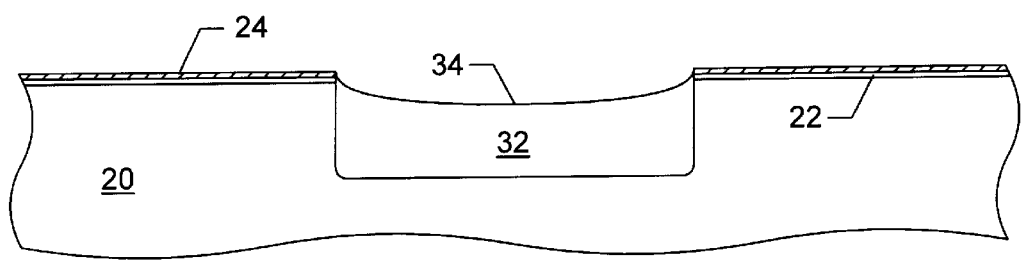
FIG. 4 is a partial cross-sectional view of the semiconductor topography, wherein the surface of the semiconductor topography is polished down to a level spaced below the original upper surface of the nitride layer using a conventional CMP technique, subsequent to the step in FIG. 3.
Figure 5:
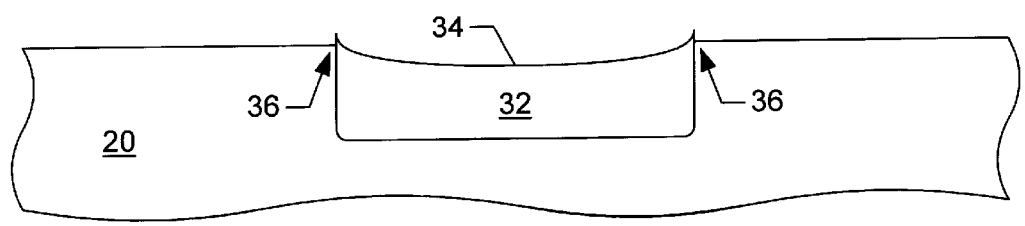
FIG. 5 is a partial cross-sectional view of a semiconductor topography, wherein the nitride layer is removed from the substrate to expose the upper corners of a trench isolation structure formed from the fill oxide, subsequent to the step in FIG. 4.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIGS. 6–9 depict planarization of a fill oxide deposited into an isolation trench and across a polish stop layer formed adjacent the trench such that a recess region of the fill oxide is spaced below the polish stop surface. It is to be understood that an embodiment of the present invention may be generally applied to the planarization of a dielectric formed within a trench.

Figure 6:
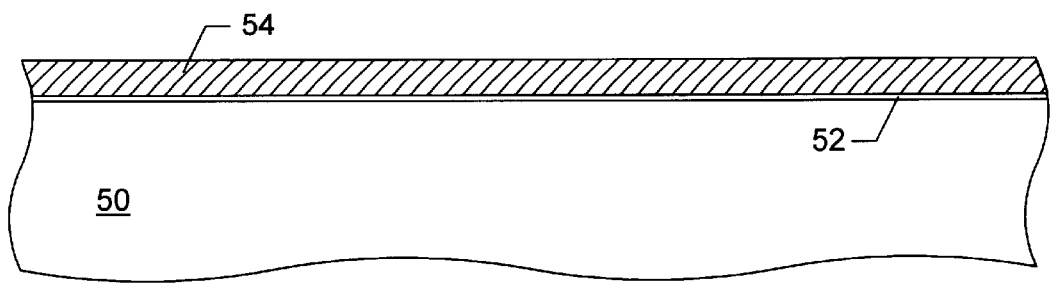
FIG. 6 is a partial cross-sectional view of the semiconductor topography according to an embodiment of the present invention, wherein a pad oxide layer and a nitride layer are formed upon a semiconductor substrate.
Figure 7:
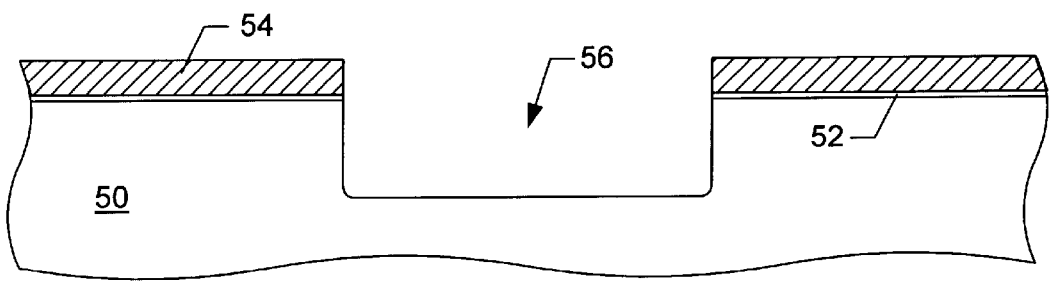
FIG. 7 is a partial cross-sectional view of the semiconductor topography, wherein portions of the pad oxide layer, the nitride layer, and the substrate are etched to form a trench within the substrate, subsequent to the step in FIG. 6.

Turning to FIG. 6, a partial cross-sectional view of a semiconductor substrate is depicted. Substrate 50 may comprise single crystalline silicon slightly doped with n-type or p-type impurities. A pad oxide layer 52 may either be thermally grown or CVD deposited from, e.g., a silane- and oxygen-bearing gas upon substrate 50. A nitride layer 54 may be CVD deposited across pad oxide layer 52. The nitride deposition may be performed using, e.g., a horizontal tube LPCVD reactor provided with a silane- and ammonia-containing gas. Pad oxide layer 52 serves as to reduce inherent stresses between nitride layer 54 and silicon-based substrate 50. As shown in FIG. 7, portions of nitride layer 54, pad oxide layer 52, and substrate 50 are then etched away to form a relatively shallow trench 56 to a depth spaced below the upper surface of the substrate. A photoresist layer may be patterned above select portions of nitride layer 54 prior to the etch step using a well known optical lithography technique. Those portions of nitride layer 54, oxide layer 52, and substrate 50 not covered by the photoresist layer may be etched for a predetermined period of time using, e.g., a dry, plasma etch technique.

Figure 8:
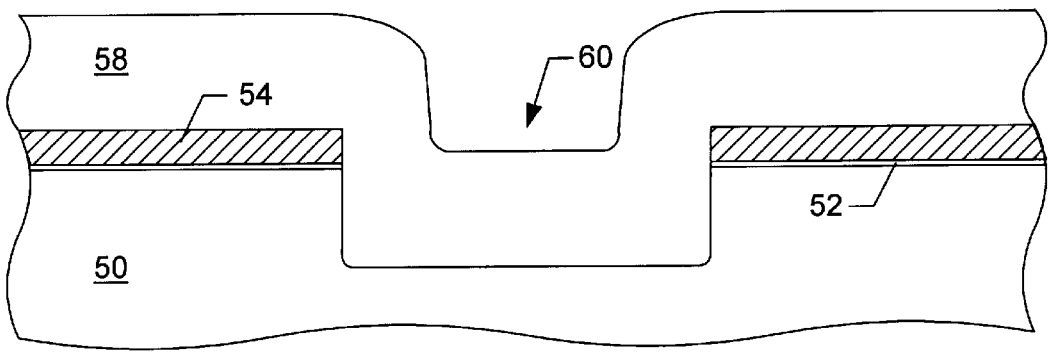
FIG. 8 is a partial cross-sectional view of the semiconductor topography, wherein a fill oxide is deposited into the trench and across the nitride layer such that a recess region of the upper surface of the fill oxide is spaced below the upper surface of the nitride layer, subsequent to the step in FIG. 7.

FIG. 8 depicts a fill dielectric 58 being CVD deposited into trench 56 and across nitride layer 54. A recess 60 may result in the upper surface of fill oxide 58 above the trench region. Fill dielectric 58 is deposited across the semiconductor topography for the time duration required to position recess 60 below the elevational level across which the upper surface of nitride layer 54 extends. Thus, the thickness, $t_2$, of fill oxide 58 above the upper surface of nitride layer 54 may be less than, e.g., 4000 Å. Further, recess region 60 is formed above the elevational level commensurate with the uppermost surface of substrate 50. It should be noted that fill oxide 58 is not drawn to scale, nor are the various other layers which form an elevationally disparate upper surface.

Figure 9:
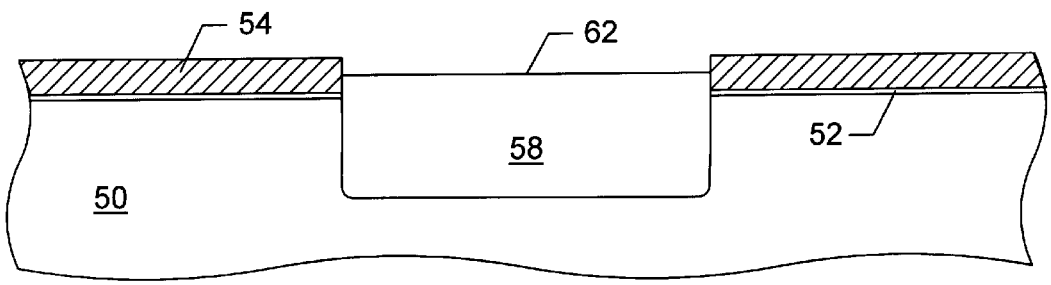
FIG. 9 is a partial cross-sectional view of the semiconductor topography, wherein raised regions of the fill oxide are polished to the recess region without removing the nitride layer, thereby forming a trench isolation structure having a planar upper surface, subsequent to the step in FIG. 8.
Figure 10:
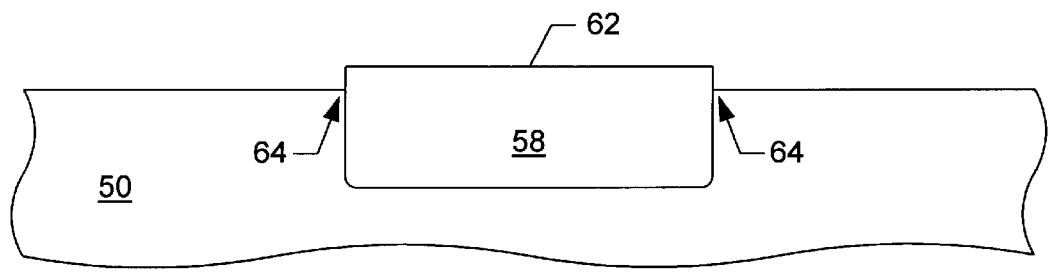
FIG. 10 is a partial cross-sectional view of the semiconductor topography, wherein the nitride layer and the pad oxide layer are removed from the substrate such that the trench isolation structure is arranged laterally adjacent corner regions of the substrate, subsequent to the step in FIG. 9.

Turning to FIG. 9, the raised regions of fill oxide 58 may be removed down to a level substantially coplanar with recessed region 60 using a polishing process according to an embodiment of the present invention. An apparatus similar in some respects to that shown in FIG. 1 may be used for the polishing process. The apparatus in FIG. 1 is purposefully modified to accommodate an abrasive polishing surface, wherein the conduit delivers a particle-free solution. As a result of fill oxide 58 being subjected to the polishing process, a trench isolation structure is formed within the trench which comprises fill oxide 58. Also, the resulting upper surface 62 of fill oxide 58 is substantially planar and is spaced below the upper surface of nitride layer 54. Nitride layer 54, being substantially dissimilar to fill oxide 58, serves as polish stop layer. Accordingly, once fill oxide 58 has been removed from above nitride layer 54 during the polishing process, only fill oxide 58 within the trench is polished. Nitride layer 54 remains intact as raised regions of fill oxide 58 are removed down to recess region 60. It is to be understood that other materials which are substantially dissimilar to oxide may be substituted for nitride layer 54. As shown in FIG. 10, nitride layer 54 and pad oxide layer 50 may be selectively etched from above substrate 50. Advantageously, lateral boundaries of corner areas 64 of substrate 50 remain covered by fill oxide 58 after the removal of nitride layer 54 and pad oxide layer 50. Absent exposing corner areas 64, the lateral edges of impurity regions subsequently formed within substrate 50 also will be strategically placed laterally adjacent peripheral regions of fill oxide 58.

Figure 11:
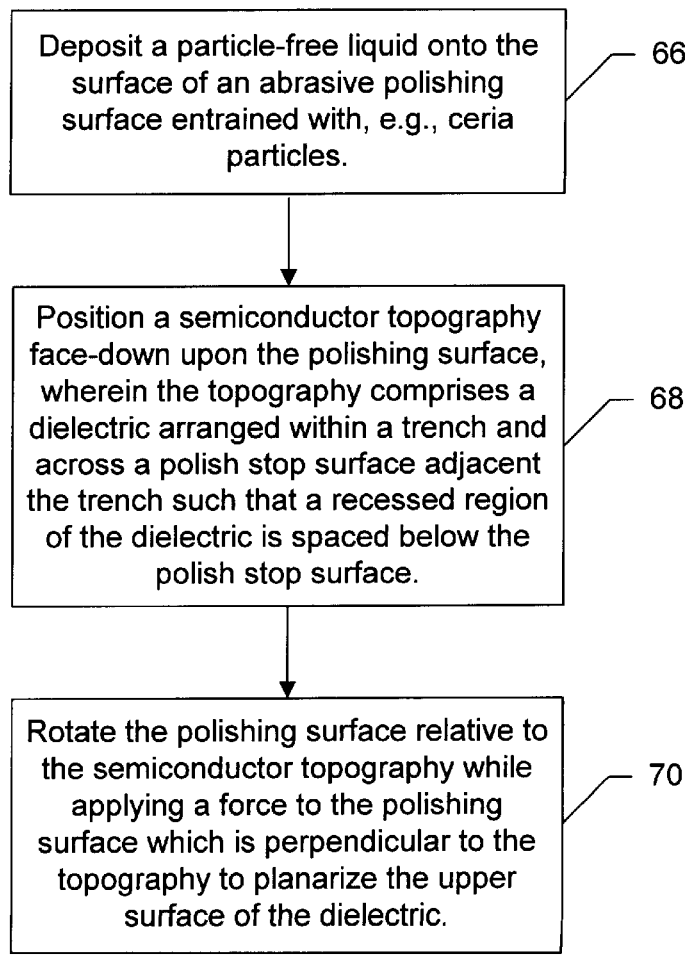
FIG. 11 is a process flow diagram of the steps performed during the planarization process of the present invention.

FIG. 11 is a process flow diagram of the polishing process employed to planarize the surface of fill oxide 58 while forming a trench isolation structure. As described in block 66, a particle-free liquid is dispensed onto an abrasive polishing surface of a polishing pad. The polishing surface comprises a polymer-based matrix entrained with abrasive particles. Appropriate materials that may be used for the particles include, but are not limited to, ceria, α alumina, γ alumina, silicon dioxide, titania, chromia, and zirconia. Preferably, the polishing liquid forwarded onto the abrasive polishing surface is deionized water. The polishing liquid may also be other types of liquids which have a near-neutral pH. It is desirable to avoid using a polishing fluid having a highly acidic or basic pH so as to inhibit the polish rate of the nitride layer from becoming too large.

As shown in block 68 of FIG. 11, the semiconductor topography depicted in FIG. 8 may be positioned face-down upon the polishing surface. The polishing liquid is positioned at the interface between the semiconductor topography and the abrasive polishing surface. A force substantially perpendicular to the backside of the semiconductor topography may then be applied upon the polishing pad, pressing the topography against the abrasive polishing surface as depicted in block 70 of FIG. 11. The semiconductor topography and the abrasive polishing surface may be rotated relative to each other while pressure is being applied to the polishing surface so as to remove elevationally raised regions of fill oxide 58. The polishing rate of the elevationally raised regions of fill oxide 58 is substantially greater than that of the raised regions of nitride layer 54. Further, the polishing rate of the elevated regions of fill oxide 58 is greater than that of recess region 60. It is believed that contact between fill oxide 58 and the abrasive particles as well as the polishing liquid causes the surface material of fill oxide 58 to be released from bondage with the bulk of fill oxide 58. The particles extending from the polishing surface have a sufficient hardness to dislodge the reacted surface material during abrasion of the surface material. The raised regions of the upper surface of fill oxide 58 are first polished to a level commensurate with the upper surface of nitride layer 54. As the polishing is continued, the raised regions of fill oxide 58 are removed to a level substantially coplanar with recess region 60 without significantly polishing nitride layer 54.

Figure 12B:
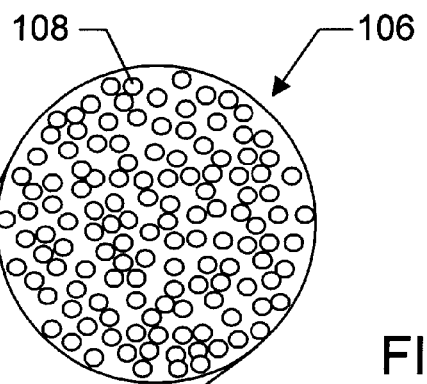
FIG. 12b is a detailed view along section 106 of FIG. 12a showing abrasive particles spaced throughout a polymeric material of the polishing pad.
Figure 12A:
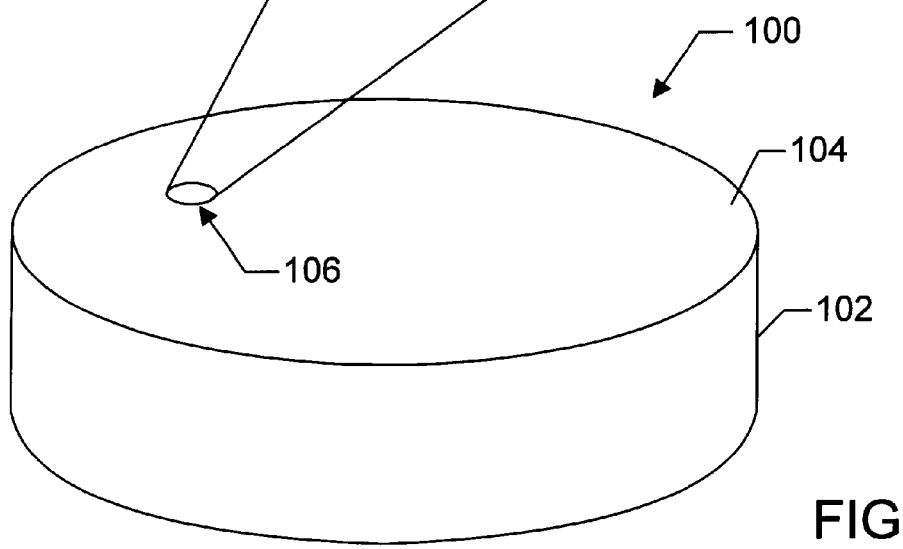
FIG. 12a is a perspective view of an abrasive polishing pad used for planarizing a topological surface.

Turning to FIG. 12a, a polishing pad 100 which may be used to polish a semiconductor topography is depicted. An appropriate polishing pad is commercially available from Minnesota Mining and Manufacturing Company. While polishing pad 100 is shown as being cylindrical, it is not limited to this shape. Polishing pad 100 includes a substantially rigid supportive backing 102 and an abrasive polishing surface 104. FIG. 12b illustrates a detailed view along section 106 of polishing surface 104. The abrasive polishing surface 104 may include abrasive particles 108 dispersed throughout and adhered within a microreplicated™ patterned matrix of polymer. The polymer matrix may, e.g., comprise the elastomeric polyurea matrix described in U.S. Pat. No. 5,273,558 (incorporated herein by reference).

It will be appreciated to those skilled in the art having the benefit of this disclosure that this invention is believed to provide a method and system using an abrasive surface and a particle-free liquid to polish a dielectric, wherein the dielectric is deposited within an isolation trench and across a polish stop surface such that a recess region of the dielectric is spaced below the polish stop surface. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for processing a dielectric, comprising positioning an abrasive polishing surface adjacent to an upper surface of the dielectric, said dielectric being within a trench and across a polish stop surface adjacent the trench such that the upper surface of the dielectric within the trench is below the polish stop surface, wherein said dielectric substantially fills the trench.

2. The method of claim 1, further comprising applying a liquid substantially free of particulate matter between the abrasive polishing surface and the upper surface of the dielectric.

3. The method of claim 1, wherein the abrasive polishing surface comprises particles partially fixed into a polymer-based matrix.

4. The method of claim 3, wherein the particles comprise a material selected from the group consisting of cerium oxide, cerium dioxide, aluminum oxide, silicon dioxide, titanium oxide, chromium oxide, and zirconium oxide.

5. The method of claim 2, further comprising moving the abrasive polishing surface relative to the upper surface of the dielectric to remove elevationally raised regions of the dielectric to a level substantially commensurate with the upper surface of the dielectric within the trench.

6. The method of claim 5, wherein said moving the abrasive polishing surface relative to the upper surface of the dielectric removes the elevationally raised regions of the dielectric at a substantially faster rate than the upper surface of the dielectric within the trench.

7. The method of claim 6, wherein said moving the polishing surface relative to the upper surface of the dielectric removes the dielectric from the polish stop surface.

8. The method of claim 7, further comprising providing a semiconductor substrate, and wherein the trench is arranged within the semiconductor substrate.

9. The method of claim 8, wherein the polish stop surface is arranged at an upper boundary of a polish stop layer formed upon an uppermost surface of the substrate exclusive of the trench.

10. The method of claim 9, wherein the polish stop layer comprises silicon nitride.

11. The method of claim 10, wherein the dielectric comprises silicon dioxide.

12. The method of claim 11, wherein said moving the polishing surface relative to the dielectric removes the dielectric at a substantially faster rate than the polish stop layer.

13. The method of claim 11, wherein said moving the polishing surface relative to the dielectric removes the elevationally raised regions of the dielectric at least twenty times faster than the polish stop layer.

14. An apparatus, comprising:
a dielectric arranged within a trench and across a polish stop surface adjacent the trench, the dielectric substantially filling the trench and comprising an upper surface having a recessed region spaced below the polish stop surface; and
an abrasive polishing surface positioned adjacent the upper surface of the dielectric during use, wherein the abrasive polishing surface is adapted to move relative to the upper surface of the dielectric.

15. The polish mechanism of claim 14, further comprising a liquid substantially free of particulate matter adapted to be placed between the abrasive polishing surface and the upper surface of the dielectric during use.

16. The polish mechanism of claim 14, wherein the abrasive polishing surface comprises a polymer-based matrix entrained with particles.

17. The polish mechanism of claim 16, wherein the particles comprise a material selected from the group consisting of cerium oxide, cerium dioxide, aluminum oxide, silicon dioxide, titanium oxide, chromium oxide, and zirconium oxide.

18. The polish mechanism of claim 16, wherein the particles are spaced across the abrasive polishing surface.

19. The polish mechanism of claim 16, wherein the particles are of sufficient hardness to remove elevationally raised portions of the dielectric.

20. The polish mechanism of claim 15, wherein the liquid comprises deionized water.

21. The polish mechanism of claim 14, wherein the trench is arranged within a semiconductor substrate.

22. The polish mechanism of claim 21, wherein the polish stop surface is arranged at an upper boundary of a polish stop layer formed upon an uppermost surface of the substrate exclusive of the trench.

23. The polish mechanism of claim 22, wherein the polish stop layer comprises silicon nitride.

24. The polish mechanism of claim 14, wherein the dielectric comprises silicon dioxide.

25. The polish mechanism of claim 14, wherein the abrasive polishing surface is adapted to remove elevationally raised regions of the upper surface of the dielectric at a substantially faster rate than the recessed region.

26. The polish mechanism of claim 23, wherein the abrasive polishing surface is adapted to remove elevationally raised regions of the upper surface of the dielectric at a substantially faster rate than the polish stop layer.

27. A method for polishing a dielectric, comprising:

positioning an abrasive polishing surface adjacent to an upper surface of the dielectric, said dielectric being within a trench and across a polish stop surface adjacent the trench such that the upper surface of the dielectric within the trench is below the polish stop surface;

applying a liquid substantially free of particulate matter between the abrasive polishing surface and the upper surface of the dielectric; and moving the abrasive polishing surface relative to the upper surface of the dielectric to remove elevationally raised regions of the dielectric to a level substantially commensurate with the upper surface of the dielectric within the trench.

28. The method of claim 27, wherein said moving the abrasive polishing surface relative to the upper surface of the dielectric removes the elevationally raised regions of the dielectric at a substantially faster rate than the upper surface of the dielectric within the trench.

29. The method of claim 28, wherein said moving the polishing surface relative to the upper surface of the dielectric removes the dielectric from the polish stop surface.

30. The method of claim 27, further comprising providing a semiconductor substrate, and wherein the trench is arranged within the semiconductor substrate.

31. The method of claim 30, wherein the polish stop surface is arranged at an upper boundary of a polish stop layer formed upon an uppermost surface of the substrate exclusive of the trench.

* * * * *